(12) United States Patent
Hu et al.

(10) Patent No.: US 8,709,865 B2
(45) Date of Patent: Apr. 29, 2014

(54) FABRICATION METHOD OF PACKAGING SUBSTRATE HAVING THROUGH-HOLED INTERPOSER EMBEDDED THEREIN

(75) Inventors: Yu-Shan Hu, Taoyuan (TW); Dyi-Chung Hu, Taoyuan (TW); Tzyy-Jang Tseng, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 13/588,030

(22) Filed: Aug. 17, 2012

(65) Prior Publication Data
US 2013/0040427 A1 Feb. 14, 2013

Related U.S. Application Data

(62) Division of application No. 13/074,467, filed on Mar. 29, 2011, now Pat. No. 8,269,337.

(30) Foreign Application Priority Data

Dec. 14, 2010 (TW) .............................. 99143617 A

(51) Int. Cl.
*H01L 21/00* (2006.01)
(52) U.S. Cl.
USPC ........... 438/106; 438/121; 438/122; 438/124; 438/126; 257/E23.006; 257/E23.009; 257/E23.011; 257/E23.174; 257/E21.503

(58) Field of Classification Search
USPC ................................ 438/121, 122, 124, 126; 257/E23.006–E23.009, E23.011
See application file for complete search history.

(56) References Cited

U.S. PATENT DOCUMENTS

| | | | |
|---|---|---|---|
| 7,375,022 B2 | 5/2008 | Oi et al. | |
| 2010/0289140 A1* | 11/2010 | Sunohara et al. | 257/737 |
| 2011/0063806 A1 | 3/2011 | Kariya et al. | |

* cited by examiner

*Primary Examiner* — Jasmine Clark
(74) *Attorney, Agent, or Firm* — Edwards Wildman Palmer LLP; Peter F. Corless; Steven M. Jensen

(57) ABSTRACT

A packaging substrate having a through-holed interposer embedded therein and a fabrication method of the packaging substrate are provided, where the packaging substrate includes: a molding layer having opposite first and second surfaces; a through-holed interposer embedded in the molding layer and flush with the second surface; a redistribution-layer structure embedded in the molding layer and disposed on the through-holed interposer and having a plurality of electrode pads exposed from the first surface of the molding layer; and a built-up structure disposed on the second surface of the molding layer and electrically connected to the through-holed interposer.

12 Claims, 8 Drawing Sheets

FABRICATION METHOD OF PACKAGING SUBSTRATE HAVING THROUGH-HOLED INTERPOSER EMBEDDED THEREIN

CROSS-REFERENCE TO RELATED APPLICATIONS

This application is a divisional of application U.S. Ser. No. 13/074,467, filed on Mar. 29, 2011, now U.S. Pat. No. 8,269,337, which claims under 35 U.S.C. §119(a) the benefit of Taiwanese Application No. 99143617, filed Dec. 14, 2010, the entire contents of which are incorporated herein by reference.

BACKGROUND OF THE INVENTION

1. Field of the Invention

The present invention relates to packaging substrates and fabrication methods thereof, and more particularly, to a packaging substrate having a through-holed interposer embedded therein and a fabrication method thereof.

2. Description of Related Art

Along with the rapid development of electronics manufacturing, electronic products are becoming low-profiled and compact-sized, as well as developed for high performance and high functionality. FIG. 1A is a cross-sectional view of a conventional flip-chip package structure.

Referring to FIG. 1A, a packaging substrate 10 having a core board 102 made of BT (Bismaleimide-Triazine) is prepared. The packaging substrate 10 has a first surface 10a with a plurality of flip-chip solder pads 100 and an opposite second surface 10b with a plurality of ball pads 101; a semiconductor chip 12 having a plurality of conductive pads 120 disposed on the first surface 10a, the conductive pads 120 being electrically connected to the solder pads 100 through a plurality of solder bumps 11, respectively; an underfill 17 used to fill the space between the first surface 10a of the packaging substrate and the semiconductor chip 12 so as to encapsulate the solder bumps 11; and a plurality of solder balls 13 mounted on the ball pads 101 for being electrically connected to another electronic device such as a printed circuit board (not shown).

Therein, when the semiconductor chip is fabricated through a process below 45 nm, its BEOL (Back-End Of Line) process requires an extreme low-k dielectric material or an ultra low-k dielectric material. However, the low-k dielectric material is porous and fragile such that in thermal cycling reliability testing after the flip-chip packaging process, a large CTE (Coefficient of Thermal Expansion) difference between the packaging substrate 10 and the semiconductor chip 12 causes an uneven thermal stress on the solder bumps 11, thereby easily resulting in cracking of the solder bumps 11 and even cracking of the semiconductor chip 12. As such, the product yield and reliability are decreased.

Further, to meet the demand for low-profiled and compact-sized electronic products, the circuit density of the semiconductor chip 12 becomes higher and pitches between the conductive pads 120 are reduced to the nano-scale. On the other hand, pitches between the flip-chip solder pads 100 of the conventional packaging substrate 10 are only at the micron-scale and cannot be effectively reduced to the nano-scale such that the conventional packaging substrate 10 does not match the semiconductor chip 12 with high circuit density, thereby adversely affecting the application of the semiconductor chip in electronic products.

To overcome the above-described drawback, a silicon interposer 14 is disposed between a packaging substrate 10 and a semiconductor chip 12', as shown in FIG. 1B. The silicon interposer 14 has a plurality of TSVs (Through-Silicon Vias) 140, the bottom ends of the TSVs 140 are electrically connected to the flip-chip solder pads 100 with large pitch through a plurality of conductive bumps 142, and a redistribution-layer 141 is disposed on the top ends of the TSVs 140. The outermost circuit of the redistribution-layer structure 141 has a plurality of electrode pads 1410 which are electrically connected to the conductive pads 120' of the semiconductor chip 12' with small pitch through a plurality of solder bumps 11'. Further, an encapsulant 18 is formed to encapsulate the semiconductor chip 12', the silicon interposer 14 and the conductive bumps 142. Therefore, the semiconductor chip 12' with high-density conductive pads 120' can be disposed on the packaging substrate 10 through the silicon interposer 14, thereby overcoming the physical mismatch between the packaging substrate and the semiconductor chip without changing the original supply chain and infrastructure of the IC industry.

Further, since the semiconductor chip 12' disposed on the silicon interposer 14 has a CTE the same as that of the silicon interposer 14 (both CTEs are 2.6 ppm), cracking of the solder bumps 11' between the semiconductor chip 12' and the silicon interposer 14 is prevented so as to effectively increase the product yield and reliability.

Although the use of the silicon interposer 14 overcomes the mismatch between the semiconductor chip 12 and the packaging substrate 10, it leads to an increase of the thickness of the overall structure, which is against the trend of thinning the package structure.

Further, to fabricate the conductive bumps 142, the wafer needs to be ground down to 100 μm thin or thinner, which leads to a high fabrication costs due to expensive devices and materials used in such a grinding process as well as labor, thereby adversely affecting mass production of the package structure.

Therefore, it is imperative to provide a packaging substrate and a fabrication method thereof so as to overcome the above-described drawbacks.

SUMMARY OF THE INVENTION

Accordingly, the present invention provides a packaging substrate having a through-holed interposer embedded therein, which comprises: a molding layer having a first surface and an opposite second surface; a through-holed interposer embedded in the molding layer and having a first side and an opposite second side and a plurality of conductive through holes penetrating the first side and the second side, wherein each of the conductive through holes has a first end surface on the first side and a second end surface on the second side, and the second side of the through-holed interposer and the second end surfaces of the conductive through holes are flush with the second surface of the molding layer; a redistribution-layer structure embedded in the molding layer and disposed on the first side of the through-holed interposer and the first end surfaces of the conductive through holes and electrically connected to the first end surfaces of the conductive through holes, wherein the outermost layer of the redistribution-layer structure has a plurality of electrode pads exposed from the first surface of the molding layer; and a built-up structure formed on the second surface of the molding layer, the second side of the through-holed interposer and the second end surfaces of the conductive through holes, wherein the built-up structure has a plurality of conductive vias, allowing a portion of the conductive vias to be electrically connected to the second end surfaces of the conductive through holes.

In the above-described packaging substrate, the first surface of the molding layer has a plurality of first openings through which the electrode pads of the redistribution-layer structure are exposed for electrically connecting a flip-chip semiconductor chip.

The present invention further provides a fabrication method of a packaging substrate having a through-holed interposer embedded therein, which comprises the steps of: providing a carrier board; providing a through-holed interposer having a redistribution-layer structure disposed thereon, wherein the through-holed interposer has a first side and an opposite second side and a plurality of conductive through holes penetrating the first side and the second side, each of the conductive through holes has a first end surface on the first side and a second end surface on the second side, the redistribution-layer structure is formed on the first side of the through-holed interposer and the first end surfaces of the conductive through holes and electrically connected to the first end surfaces of the conductive through holes, the second end surfaces of the conductive through holes are flush with the second side of the through-holed interposer so as to allow the second side and the second end surfaces of the conductive through holes to be attached to the carrier board, and the outermost layer of the redistribution-layer structure has a plurality of electrode pads; forming a molding layer on the carrier board and the redistribution-layer structure so as to embed the through-holed interposer in the molding layer, the molding layer having an exposed first surface and a second surface attached to the carrier board; forming a metal layer on the first surface of the molding layer; removing the carrier board to expose the second surface of the molding layer, the second side of the through-holed interposer, and the second end surface of the conductive through holes; forming a built-up structure on the second surface of the molding layer, the second side of the through-holed interposer, and the second end surfaces of the conductive through holes, wherein the built-up structure comprises a plurality of conductive vias, allowing a portion of the conductive vias to be electrically connected to the second end surfaces of the conductive through holes; removing the metal layer to expose the first surface of the molding layer; and forming a plurality of first openings on the first surface of the molding layer for exposing the electrode pads, respectively.

In the above-described packaging substrate and fabrication method thereof, the built-up structure can comprise at least a dielectric layer and a wiring layer formed on the dielectric layer, allowing the conductive vias to be formed in the dielectric layer for electrically connecting the wiring layer and the second end surfaces of the conductive through holes. Further, an insulating protection layer can be formed on the built-up structure and have a plurality of second openings through which portions of the wiring layer are exposed to serve as conductive pads.

Further, an antenna structure or a heat sink can be disposed on the first surface of the molding layer. Therein, the heat sink has an open region for exposing the electrode pads of the redistribution-layer structure and for receiving an electronic component.

Further, an electronic component can be embedded in the molding layer and electrically connected to the built-up structure or a chip. The electronic component can be an active component, a passive component or an integrated passive component.

The through-holed interposer can be made of single crystal silicon or polysilicon, wherein each of the conductive through holes has an insulating layer formed on the side wall thereof, and the fabrication process of the through-holed interposer and the redistribution-layer structure comprises the steps of: providing a substrate having a plurality of recesses; forming an insulating layer on the substrate and the side wall of each of the recesses, the side of the substrate having the insulating layer being defined as the first side; filling in the recesses with a metal material so as to form the conductive through holes, the first end surfaces of the conductive through holes being exposed from the first side and flush with the first side; forming the redistribution-layer structure on the first side and the first end surfaces of the conductive through holes, the redistribution-layer structure being electrically connected to the first end surfaces of the conductive through holes, and the outermost layer of the redistribution-layer structure having a plurality of electrode pads; and removing the portion of the substrate below the recesses so as to form the second side of the through-holed interposer in a manner that the second end surfaces of the conductive through holes being exposed from the second side.

Further, the through-holed interposer can be made of glass or ceramic, and the fabrication process of the through-holed interposer and the RDL process comprises the steps of: providing a substrate having one surface defined as the first side and a plurality of recesses formed on the first side; filling in the recesses with a metal material so as to form the conductive through holes, the first end surfaces of the conductive through holes being exposed from the first side and flush with the first side; forming the redistribution-layer structure on the first side and the first end surfaces of the conductive through holes, wherein the redistribution-layer structure is electrically connected to the first end surfaces of the conductive through holes and the outermost layer of the redistribution-layer structure has a plurality of electrode pads; and removing the portion of the substrate below the recesses so as to form the second side of the through-holed interposer in a manner that the second end surfaces of the conductive through holes are exposed from the second side.

Preferably, the through-holed interposer has a thickness between 75 μm and 150 μm.

Therefore, by embedding a through-holed interposer in a molding layer, the present invention avoids stacking of the through-holed interposer on a packaging substrate so as to reduce the thickness of the overall structure. Further, by forming a built-up structure on the second surface of the molding layer, the present invention eliminates the need of a core board so as to further reduce the thickness of the overall structure.

In addition, since the conductive through holes of the through-holed interposer electrically connect to the conductive vias of the built-up structure, the present invention eliminates the need of mounting conductive bumps on the end surfaces of the conductive through holes as in the prior art, thereby reducing the fabrication costs and facilitating mass production.

DETAILED DESCRIPTION OF PREFERRED EMBODIMENTS

The following illustrative embodiments are provided to illustrate the disclosure of the present invention, these and other advantages and effects can be apparent to those in the art after reading this specification.

FIGS. 2A to 2F are cross-sectional views showing a fabrication method of a packaging substrate having a through-holed interposer embedded therein according to the present invention.

Figure 1A:
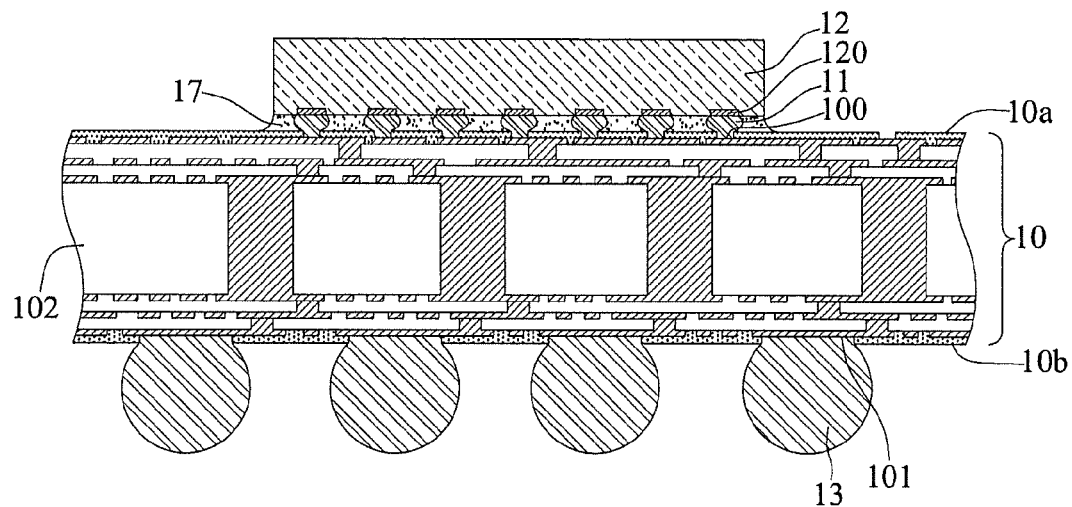
FIG. 1A is a cross-sectional view of a conventional flip-chip package structure.
Figure 1B:
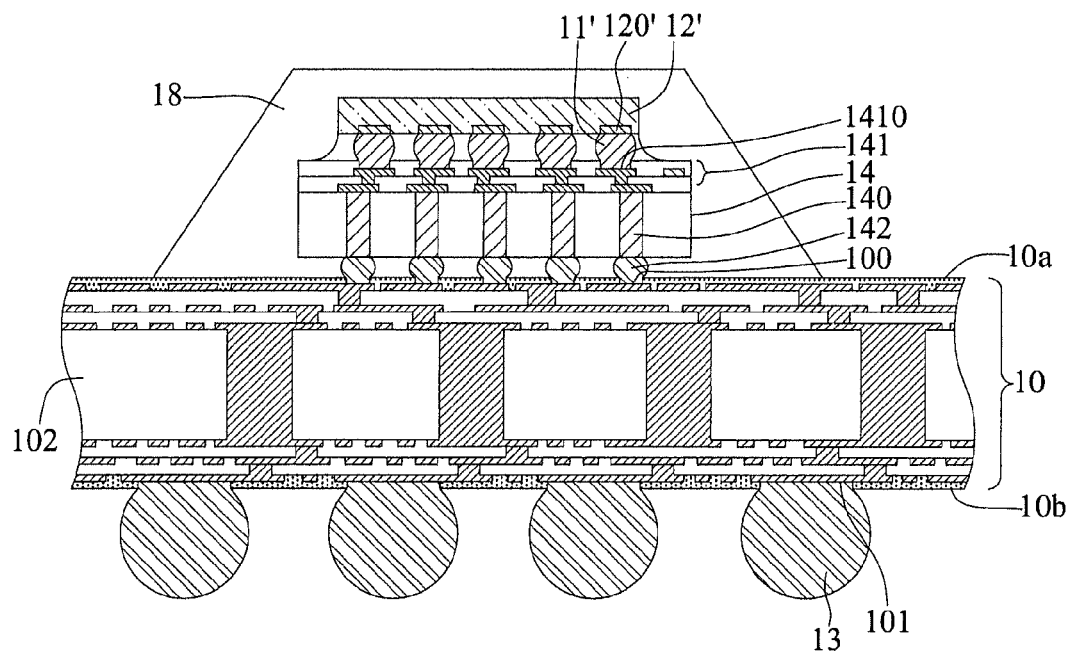
FIG. 1B is a cross-sectional view of a conventional package substrate having a silicon interposer.
Figure 2A:
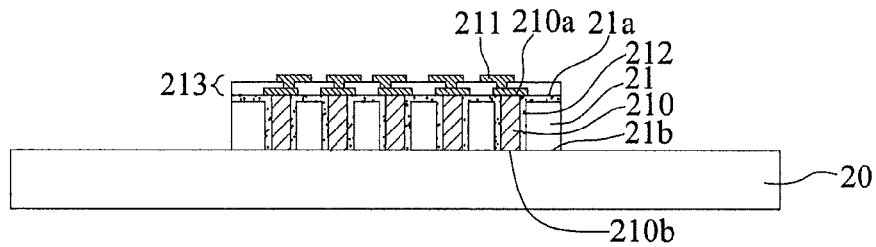
FIGS. 2A to 2F are cross-sectional views showing a fabrication method of a packaging substrate having a through-holed interposer embedded therein.

Referring to FIG. 2A, a carrier board 20 and a through-holed interposer 21 having a redistribution-layer 213 disposed thereon are provided.

The through-holed interposer 21 has a first side 21a, an opposite second side 21b, and a plurality of conductive through holes 210 penetrating the first side 21a and the second side 21b. Each of the conductive through holes 210 has a first end surface 210a on the first side 21a and a second end surface 210b on the second side 21b, and the second end surface 210b is flush with the second side 21b so as to allow the second side 21b and the second end surface 210b to be attached to the carrier board 20. Preferably, the through-holed interposer 21 has a thickness between 75 μm and 150 μm.

The redistribution-layer structure 213 is formed on the first side 21a of the through-holed interposer 21 and the first end surfaces 210a of the conductive through holes 210. The innermost circuit of the redistribution-layer structure 213 is electrically connected to the first end surfaces 210a of the conductive through holes 210, and the outermost circuit of the redistribution-layer structure 213 has a plurality of electrode pads 211.

Figure 2B:
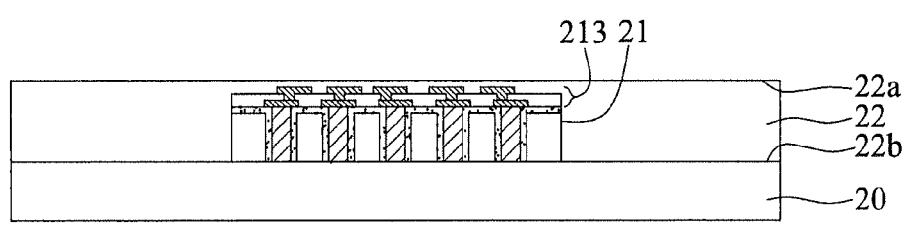

Referring to FIG. 2B, a molding layer 22 is formed on the carrier board 20 and the redistribution-layer structure 213 so as to embed the through-holed interposer 21 in the molding layer 22. The molding layer 22 has an exposed first surface 22a and a second surface 22b attached to the carrier board 20.

Figure 2C:
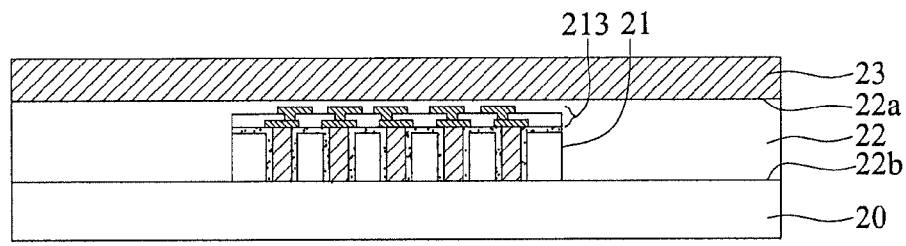

Referring to FIG. 2C, a metal layer 23 is formed on the first surface 22a of the molding layer 22.

Figure 2D:
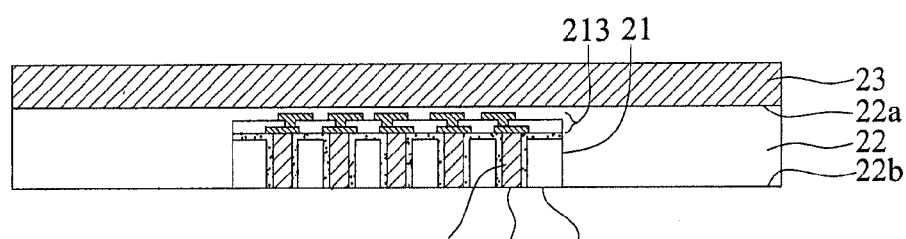

Referring to FIG. 2D, the carrier board 20 is removed to expose the second surface 22b of the molding layer 22, the second side 21b of the through-holed interposer 21, and the second end surfaces 210b of the conductive through holes 210.

Figure 2E:
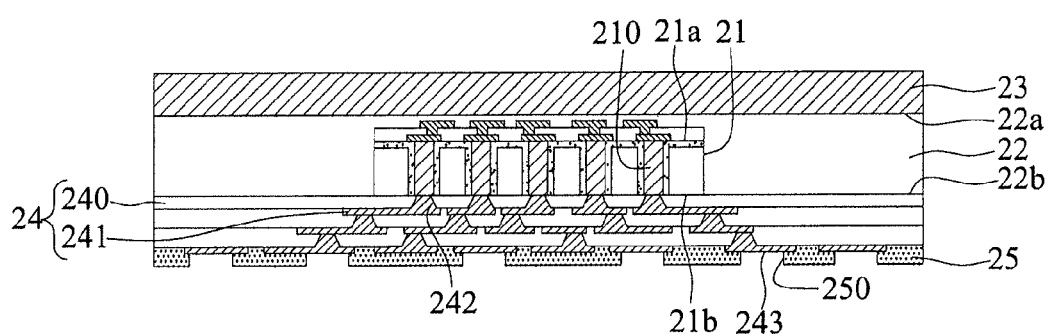

Referring to FIG. 2E, a built-up structure 24 is formed on the second surface 22b of the molding layer 22, the second side 21b of the through-holed interposer 21, and the second end surfaces 210b of the conductive through holes 210 through a fan-out technology. The built-up structure 24 has a plurality of conductive vias 242, allowing a portion of the conductive vias 242 to be electrically connected to the second end surfaces 210b of the conductive through holes 210.

The built-up structure 24 further comprises at least a dielectric layer 240 and a wiring layer 241 formed on the dielectric layer 240, such that the conductive vias 242 are formed in the dielectric layer 240 for electrically connecting the wiring layer 241 and the second end surfaces 210b of the conductive through holes 210. Furthermore, an insulating protection layer 25 such as a solder mask layer is formed on the outermost dielectric layer 240 and the wiring layer 241 of the built-up structure 24, and has a plurality of second openings 250 through which portions of the outermost wiring layer 241 are exposed to serve as conductive pads 243.

Figure 2F:
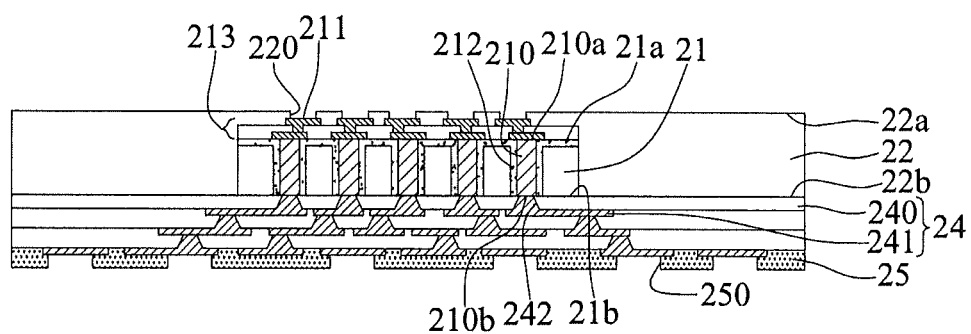
Figure 2G:
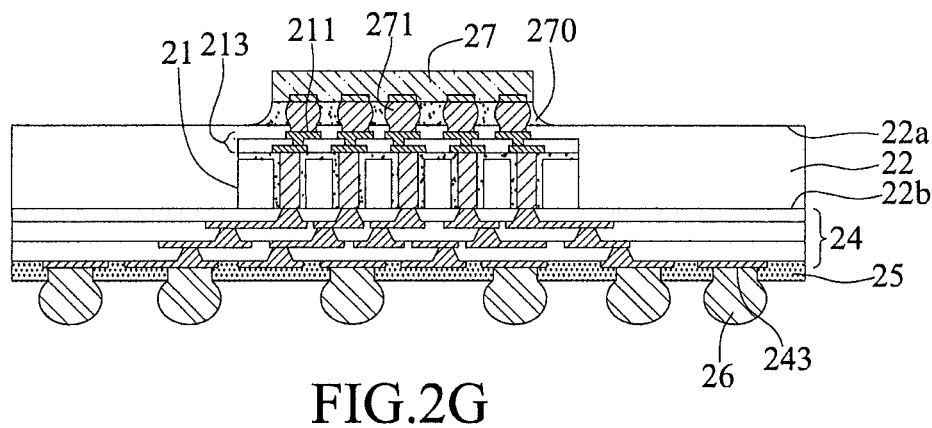
FIG. 2G is a cross-sectional view showing an application example of the packaging substrate according to the present invention.

Referring to FIG. 2F, the metal layer 23 is removed to expose the first surface 22a of the molding layer 22, and a plurality of first openings 220 are formed on the first surface 22a of the molding layer 22 for exposing the electrode pads 211, respectively.

Compared with the conventional packaging substrate having a silicon interposer stacked thereon, the present invention embeds the through-holed interposer 21 in the molding layer 22 so as to effectively reduce the thickness of the overall structure. Further, by forming the built-up structure 24 on the second surface 22b of the molding layer 22, the present invention eliminates the need of a conventional core board, thereby further reducing the thickness of the overall structure.

Furthermore, since the conductive through holes 210 of the through-holed interposer 21 electrically connect to the conductive vias 242 of the built-up structure 24, the present invention eliminates the need of mounting conductive bumps on the second end surfaces 210b of the conductive through holes 210 as in the prior art, thereby effectively reducing the fabrication cost and facilitating mass production.

Referring to FIG. 2O, which is an application example of the packaging substrate of the present invention, a chip 27 is flip-chip electrically connected to the electrode pads 211 of the redistribution-layer structure 213 through a plurality of solder bumps 271, an underfill 270 is used to fill the space between the electrode pads 211 and the chip 27, and a plurality of solder balls 26 are mounted on the conductive pads 243, respectively, for being electrically connected to another electronic device such as a printed circuit board (not shown). Therein, the chip 27 can be an active component such as a semiconductor chip, or a passive component such as a capacitor, a resistor or an inductor. Alternatively, instead of the chip 27, a plurality of stack chips can be disposed on the packaging substrate.

Compared with the conventional flip-chip packaging substrate, as the present invention attaches the chip 27 to the through-holed interposer 21 of the packing substrate the improve product reliability can be improved.

FIGS. 3A to 3D and FIGS. 4A to 4D show different structures and fabrication methods of the through-holed interposer 21.

Referring to FIGS. 3A to 3D, the through-holed interposer 21 is made of single crystal silicon or polysilicon.

Figure 3A:
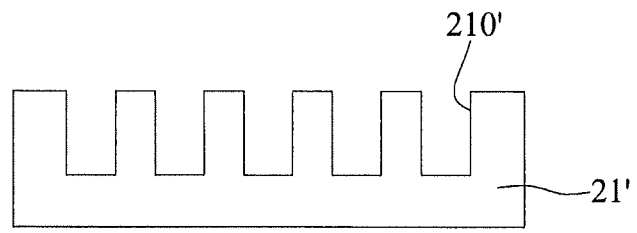
FIGS. 3A to 3D are cross-sectional views showing a fabrication method of the through-holed interposer according to an embodiment of the present invention.

Referring to FIG. 3A, a substrate 21' having a plurality of recesses 210' is provided.

Figure 3B:
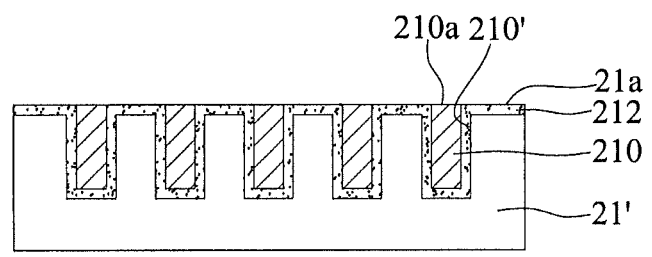

Referring to FIG. 3B, an insulating layer 212 is formed on the substrate 21' and the side wall of each of the recesses 210'. The side of the substrate 21' having the insulating layer 212 is defined as the first side 21a. Then, a metal material is used to fill the recesses 210' so as to form the conductive through holes 210 in a manner that the first end surfaces 210a of the conductive through holes 210 are exposed from the first side 21a and flush with the first side 21a.

Figure 3C:
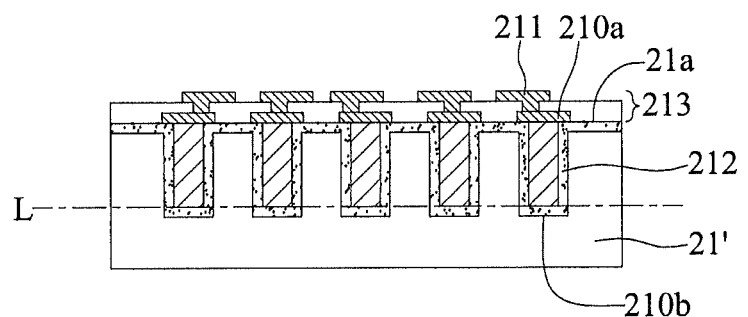

Referring to FIG. 3C, the redistribution-layer structure 213 is formed on the first side 21a and the first end surfaces 210a of the conductive through holes 210, wherein the innermost circuit of the redistribution-layer structure 213 is electrically connected to the first end surfaces 210a of the conductive through holes 210. Further, the outermost circuit of the redistribution-layer structure 213 has a plurality of electrode pads 211.

Figure 3D:
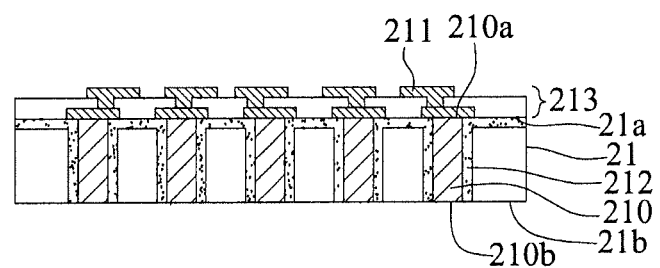

Referring to FIG. 3D, a thinning process is performed to remove the portion of the substrate 21' below the recesses 210' (below the line L of FIG. 3C) so as to form the second side 21b of the through-holed interposer 21, allowing the second end surfaces 210b of the conductive through holes 210 to be exposed from the second side 21b.

In the above-described fabrication process, the insulating layer 211 can prevent conductive connection between the conductive through holes 210 and the silicon material of the through-holed interposer 21, thereby avoiding the risk of short circuits.

Referring to FIGS. 4A to 4D, the through-holed interposer 21 is made of glass or ceramic such as $Al_2O_3$ and MN, wherein the ceramic has a CTE of about 3 ppm/° C. that is close to silicon.

Figure 4A:
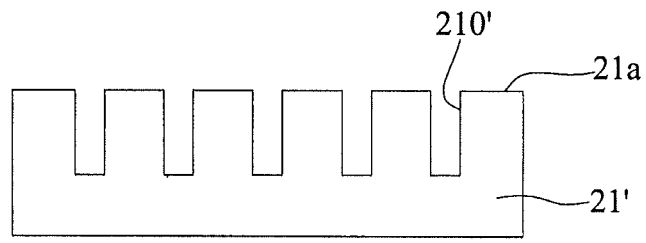
FIGS. 4A to 4D are cross-sectional views showing a fabrication method of the through-holed interposer according to another embodiment of the present invention.

Referring to FIG. 4A, a substrate 21' is provided, which has one surface defined as the first side 21a and has a plurality of recesses 210' formed on the first side 21a.

Figure 4B:
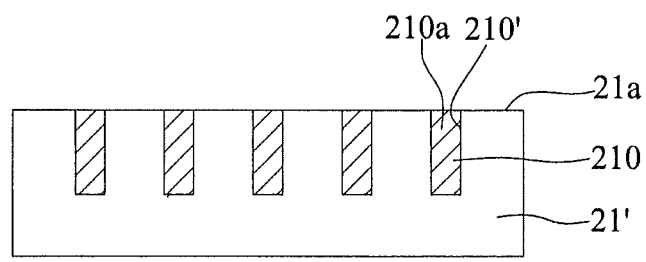

Referring to FIG. 4B, a metal material is used to fill the recesses 210' so as to form the conductive through holes 210, allowing the first end surfaces 210a of the conductive through holes 210 to be exposed from the first side 21a and flush with the first side 21a.

Figure 4C:
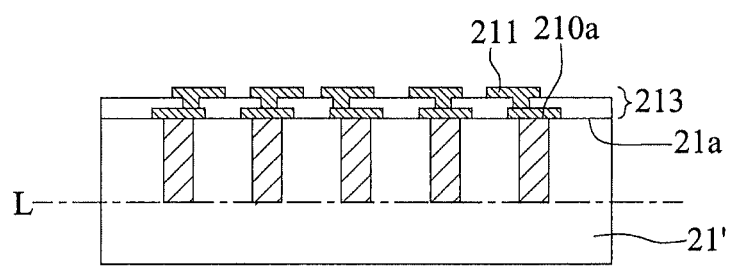

Referring to FIG. 4C, the redistribution-layer structure 213 is formed on the first side 21a and the first end surfaces 210a of the conductive through holes 210, and the innermost circuit of the redistribution-layer structure 213 is electrically connected to the first end surfaces 210a of the conductive through holes 210. Further, the outermost circuit of the redistribution-layer structure 213 has a plurality of electrode pads 211.

Figure 4D:
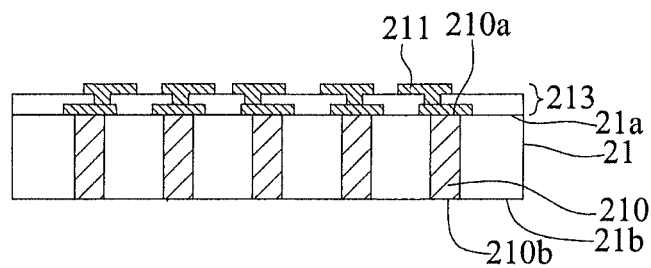

Referring to FIG. 4D, the portion of the substrate 21' below the recesses 210' (below the line L of FIG. 4C) is removed to form the second side 21b of the through-holed interposer 21, such that the second end surfaces 210b of the conductive through holes 210 are exposed from the second side 21b.

In the above-described process, since the through-holed interposer 21 is made of glass or ceramic, the need to form an insulating layer 212 in the recesses 210' is eliminated.

By embedding the through-holed interposer 21 in the molding layer 22, the present invention eliminates the need to fabricate conductive bumps on the second end surfaces 210b of the conductive through holes 210, thereby reducing fabrication costs.

Further, since the through-holed interposer 21 has a CTE close to or the same as that of a silicon wafer, the structural reliability during thermal cycle testing after a packaging process is improved.

Figure 5A:
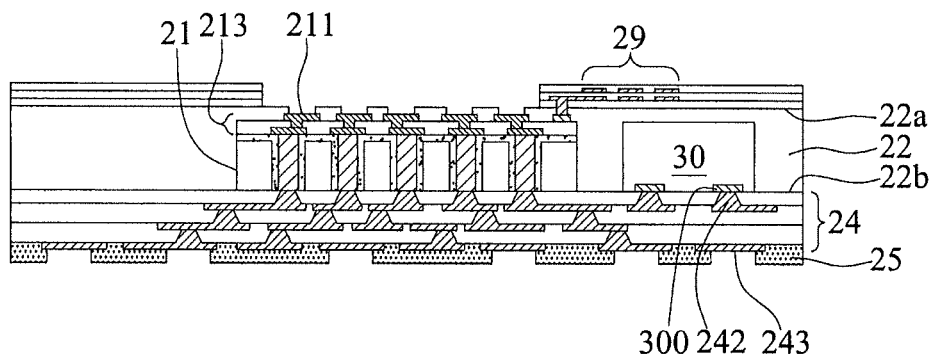
FIGS. 5A, 6A and 7A are cross-sectional views showing other embodiments of the packaging substrate according to the present invention.
Figure 5B:
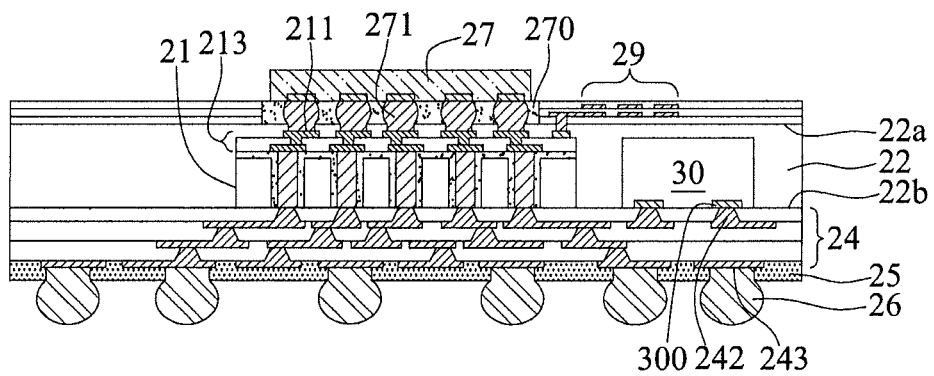
FIGS. 5B, 6B and 7B are cross-sectional views showing application of the packaging substrates of FIGS. 5A, 6A and 7A, respectively.
Figure 6A:
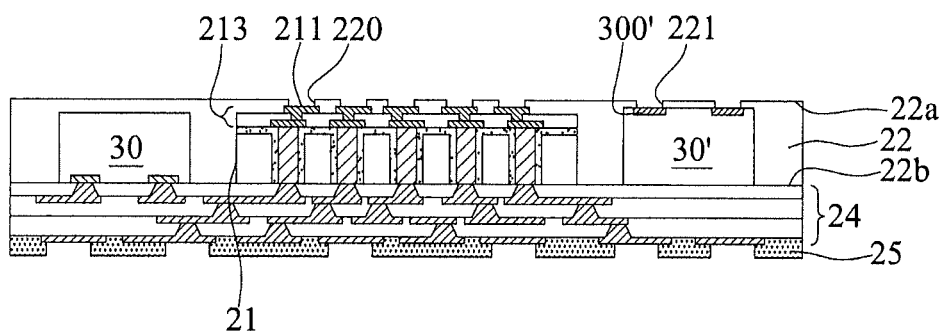
Figure 6B:
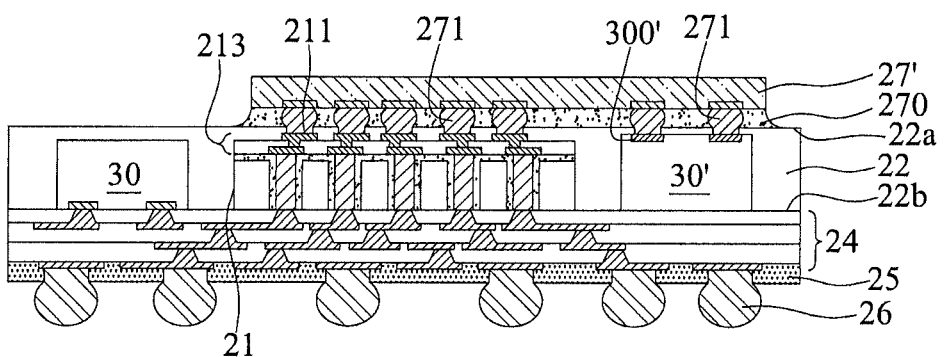
Figure 7A:
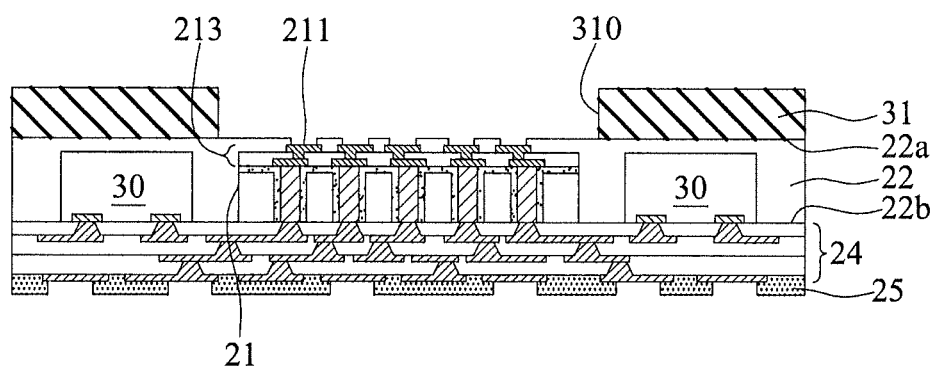
Figure 7B:
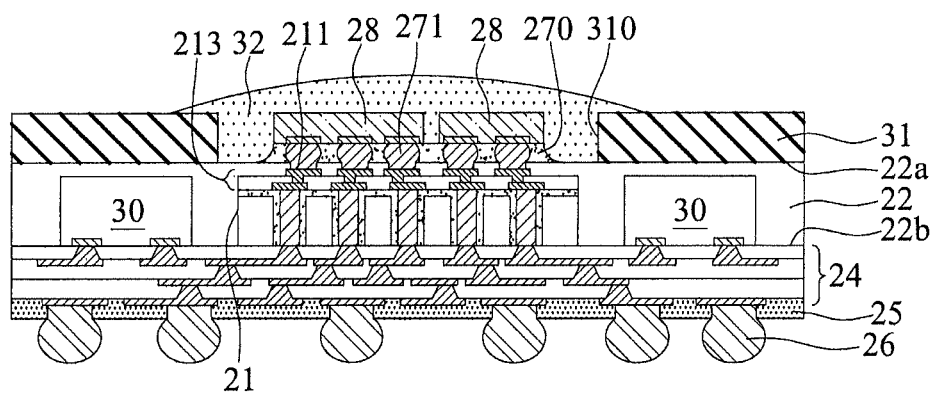

FIGS. 5A, 6A, 7A show other embodiments of the packaging substrate having the embedded through-holed interposer 21 and FIGS. 5B, 6B, 7B show application of the packaging substrates of FIGS. 5A, 6A and 7A, respectively.

Referring to FIG. 5A, which is continued from FIG. 2F, an antenna structure 29 is formed on the first surface 22a of the molding layer 22 and embedded in a dielectric material. Further, before the process of forming the molding layer 22 (before the process of FIG. 2B), a first electronic component 30 having a plurality of conductive pads 300 can be attached to the carrier board 20 so as to be embedded in the molding layer 22; and during the process of forming the built-up structure 24, the first electronic component 30 is electrically connected to the conductive vias 242 of the built-up structure 24 through the conductive pads 300. The first electronic component 30 can be an active component (such as a semiconductor chip), a passive component (a capacitor, an inductor or a resistor) or an integrated passive component.

Referring to FIG. 5B, a chip 27 is flip-chip electrically connected to the electrode pads 211 of the redistribution-layer 213 through a plurality of solder bumps 271, an underfill 270 is used to fill the space between the electrode pads 211 and the chip 27, and a plurality of solder balls 26 are mounted on the conductive pads 243 for being electrically connected to another electronic device such as a printed circuit board (not shown).

Referring to FIG. 6A, before the process of forming the molding layer 22, a second electronic component 30' having a plurality of conductive pads 300' can be attached to the carrier board 20 so as to be embedded in the molding layer 22, and the conductive pads 300' of the second electronic component 30' are exposed through a plurality of third openings 221 of the molding layer 22, respectively. The second electronic component 30' can be an active component (such as a semiconductor chip), a passive component (a capacitor, an inductor or a resistor) or an integrated passive component.

Referring to FIG. 6B, a chip 27' is flip-chip electrically connected to the electrode pads 211 and the conductive pads 300' through a plurality of solder bumps 271, an underfill 270 is used to fill the space between the packaging substrate and the chip 27', and a plurality of solder balls 26 are mounted on the conductive pads 243 for being electrically connected to another electronic device such as a printed circuit board (not shown).

Referring to FIG. 7A, a first electronic component 30 is embedded in the molding layer 22, and a heat sink 31 is disposed on the first surface 22a of the molding layer 22 and has an open region 310 for exposing the electrode pads 211 of the redistribution-layer structure 213 and for receiving an electronic component.

Referring to FIG. 7B, two chips 28 are received in the open region 310 of the heat sink 31 and flip-chip electrically connected to the electrode pads 211 through a plurality of solder bumps 271, and a packaging material such as a thermal adhesive 32 is applied in the open region 310 and on the chips 28 and the heat sink 31 so as to encapsulate the chips 28.

In the above-described embodiments and applications, components such as the antenna structure 29, the first electronic component 30, the second electronic component 30' and the heat sink 31 can be added to the packaging substrate according to the practical need, and the types of the components are not limited to the above-described embodiments. Further, there is no limit on the number of the chips 27, 27', 28.

The present invention further provides a packaging substrate having a through-holed interposer 21 embedded therein, which comprises: a molding layer 22 having a first surface 22a and an opposite second surface 22b; a through-holed interposer 21 embedded in the molding layer 22; a redistribution-layer structure 213 embedded in the molding layer 22 and formed on the through-holed interposer 21; and a built-up structure 24 formed on the second surface 22b of the molding layer 22.

The first surface 22a of the mold layer 22 has a plurality of first openings 220.

The through-holed interposer 21 has a first side 21a and an opposite second side 21b, and a plurality of conductive through holes 210 penetrating the first side 21a and the second side 21b, wherein each of the conductive through holes 210 has a first end surface 210a on the first side 21a and a second end surface 210b on the second side 21b, the second side 21b and the second end surface 210b of each of the conductive through holes 210 being flush with the second surface 22b of the molding layer 22. The through-holed interposer 21 can be made of glass, ceramic, single crystal silicon or polysilicon, wherein if the through-holed interposer 21 is made of single crystal silicon or polysilicon, each of the conductive through holes 210 has an insulating layer 212 formed on the side wall thereof.

The redistribution-layer structure 213 is formed on the first side 21a of the through-holed interposer 21 and the first end surfaces 210a of the conductive through holes 210, wherein the innermost circuit of the redistribution-layer structure 213 is electrically connected to the first end surfaces 210a of the conductive through holes 210 and the outermost circuit of the redistribution-layer 213 has a plurality of electrode pads 211 exposed from the first openings 220 of the molding layer 22 for electrically connecting at least a semiconductor chip 27, 27', 28.

The built-up structure 24 is formed on the second side 21b of the through-holed interposer 21 and the second end surfaces 210b of the conductive through holes 210. The built-up structure 24 comprises at least a dielectric layer 240, a wiring layer 241 formed on the dielectric layer 240, and a plurality of conductive vias 242 formed in the dielectric layer 240 for electrically connecting the wiring layer 241 and the second end surfaces 210b of the conductive through holes 210.

The packaging substrate further comprises an insulating protection layer 25 formed on the built-up structure 24 and having a plurality of second openings 250 through which portions of the wiring layer 241 are exposed to serve as conductive pads 243 so as for solder balls 26 to be mounted thereon.

The packaging substrate further comprises an antenna structure 29 disposed on the first surface 22a of the molding layer 22.

The packaging substrate further comprises a first electronic component 30 embedded in the molding layer 22 and electrically connected to the built-up structure 24.

The packaging substrate further comprises a second electronic component 30' embedded in the molding layer 22 and having a plurality of conductive pads 300' exposed from the molding layer 22.

The packaging substrate further comprises a heat sink 31 disposed on the first surface 22a of the molding layer 22 and has an open region 310 for exposing the electrode pads 211 of the redistribution-layer 213 and for receiving an electronic component.

Therefore, by embedding a through-holed interposer in a molding layer and forming a built-up structure on the molding layer, the present invention avoids stacking of the through-holed interposer on a packaging substrate and eliminates the need of a core board as in the prior art, thereby effectively reducing the thickness of the overall structure.

Further, since the conductive through holes of the through-holed interposer electrically connect to the conductive vias of a built-up structure, the present invention eliminates the need of mounting conductive bumps on the end surfaces of the conductive through holes to thereby reduce fabrication costs.

Furthermore, a chip can be attached to the through-holed interposer so as to improve product reliability.

The above-described descriptions of the detailed embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A fabrication method of a packaging substrate having a through-holed interposer embedded therein, comprising the steps of:
    providing a through-holed interposer having a redistribution-layer structure disposed thereon, wherein the through-holed interposer has a first side and an opposite second side and a plurality of conductive through holes penetrating the first side and the second side, each of the conductive through holes has a first end surface on the first side and a second end surface on the second side, the redistribution-layer structure is formed on the first side of the through-holed interposer and the first end surfaces of the conductive through holes and electrically connected to the first end surfaces of the conductive through holes, the second end surfaces of the conductive through holes are flush with the second side of the through-holed interposer so as to allow the second side and the second end surfaces of the conductive through holes to be attached to a carrier board, and an outermost layer of the redistribution-layer structure has a plurality of electrode pads;
    forming a molding layer on the carrier board and the redistribution-layer structure so as to embed the through-holed interposer in the molding layer, wherein the molding layer has an exposed first surface and a second surface attached to the carrier board;
    forming a metal layer on the first surface of the molding layer;
    removing the carrier board to expose the second surface of the molding layer, the second side of the through-holed interposer and the second end surfaces of the conductive through holes;
    forming a built-up structure on the second surface of the molding layer, the second side of the through-holed interposer, and the second end surfaces of the conductive through holes, wherein the built-up structure comprises a plurality of conductive vias, wherein a portion of the conductive vias are electrically connected to the second end surfaces of the conductive through holes;
    removing the metal layer to expose the first surface of the molding layer; and
    forming a plurality of first openings on the first surface of the molding layer for exposing the electrode pads, respectively.

2. The method of claim 1, wherein the through-holed interposer is made of single crystal silicon or polysilicon, the fabrication process of the through-holed interposer and the redistribution-layer structure comprising the steps of:
    providing a substrate having a plurality of recesses;
    forming an insulating layer on the substrate and a side wall of each of the recesses, a side of the substrate having the insulating layer being defined as the first side;
    filling in the recesses with a metal material to form the conductive through holes, allowing the first end surfaces of the conductive through holes to be exposed from the first side and flush with the first side;
    forming the redistribution-layer structure on the first side and the first end surfaces of the conductive through holes, wherein the redistribution-layer structure is electrically connected to the first end surfaces of the conductive through holes and the outermost layer of the redistribution-layer structure is formed with a plurality of electrode pads; and
    removing a portion of the substrate below the recesses to form the second side of the through-holed interposer, so as for the second end surfaces of the conductive through holes to be exposed from the second side.

3. The method of claim 1, wherein the through-holed interposer is made of glass or ceramic, and the fabrication process of the through-holed interposer and the redistribution-layer structure comprises the steps of:

provided a substrate having one surface defined as the first side and a plurality of recesses formed on the first side;

filling in the recesses with a metal material so as to form the conductive through holes, the first end surfaces of the conductive through holes being exposed from the first side and flush with the first side;

forming the redistribution-layer structure on the first side and the first end surfaces of the conductive through holes, wherein the redistribution-layer structure is electrically connected to the first end surfaces of the conductive through holes and the outermost layer of the redistribution-layer structure is formed with a plurality of electrode pads; and removing a portion of the substrate below the recesses to form the second side of the through-holed interposer, so as for the second end surfaces of the conductive through holes to be exposed from the second side.

4. The method of claim 1, wherein the through-holed interposer has a thickness between 75 μm and 150 μm.

5. The method of claim 1, wherein the built-up structure further comprises at least a dielectric layer and a wiring layer formed on the dielectric layer, and the conductive vias are disposed in the dielectric layer for electrically connecting the wiring layer and the second end surfaces of the conductive through holes.

6. The method of claim 5, further comprising the step of forming an insulating protection layer on the built-up structure and forming in the insulating protection layer a plurality of second openings through which portions of the wiring layer are exposed to serve as conductive pads.

7. The method of claim 1, further comprising the step of forming an antenna structure on the first surface of the molding layer.

8. The method of claim 1, further comprising the step of attaching a first electronic component on the carrier board so as to embed the first electronic component in the molding layer and electrically connect the first electronic component to the built-up structure.

9. The method of claim 8, wherein the first electronic component is an active component, a passive component or an integrated passive component.

10. The method of claim 1, further comprising the step of attaching on the carrier board a second electronic component having a plurality of conductive pads in a manner that the second electronic component is embedded in the molding layer and the conductive pads of the second electronic component are exposed from the molding layer.

11. The method of claim 10, wherein the second electronic component is an active component, a passive component or an integrated passive component.

12. The method of claim 1, further comprising the step of disposing a heat sink on the first surface of the molding layer, wherein the heat sink has an open region for exposing the electrode pads of the redistribution-layer and for receiving an electronic component.

* * * * *